(12) United States Patent
Huang et al.

(10) Patent No.: US 11,137,782 B2
(45) Date of Patent: Oct. 5, 2021

(54) SYSTEM AND METHOD FOR CONTROLLING A DYNAMIC VOLTAGE REGULATOR SLEW RATE IN AN INFORMATION HANDLING SYSTEM

(71) Applicant: DELL PRODUCTS, LP, Round Rock, TX (US)

(72) Inventors: Johnny Tc Huang, New Taipei (TW); Tse-An Gino Chu, Zhongshan District (TW)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 16/689,370

(22) Filed: Nov. 20, 2019

(65) Prior Publication Data
US 2021/0149425 A1 May 20, 2021

(51) Int. Cl.
*G05F 1/56* (2006.01)
*H03K 17/082* (2006.01)
*H03K 17/08* (2006.01)

(52) U.S. Cl.
CPC ........... *G05F 1/56* (2013.01); *H03K 17/0822* (2013.01); *H03K 2017/0806* (2013.01)

(58) Field of Classification Search
CPC ... G06F 1/10; G06F 1/267; G06F 1/46; G06F 1/561; G06F 1/567; G06F 1/569; G06F 1/571; G06F 1/573; G06F 1/5735; G06F 1/461; G06F 1/462; G06F 1/463; G06F 1/465; G06F 1/466; G06F 1/467; G06F 1/56; G06F 1/562; G06F 1/563; G06F 1/565; G06F 1/575; G06F 1/577; G06F 1/585; G06F 1/59; G06F 1/595; G06F 1/607; G06F 1/61; G06F 1/613; G06F 1/614; G06F 1/618; G06F 1/62; G06F 1/66; G06F 1/08; G06F 1/153; G06F 1/16; G06F 1/26; G06F 1/34
See application file for complete search history.

(56) References Cited

U.S. PATENT DOCUMENTS

| 9,614,506 | B1* | 4/2017 | DiRenzo | H03K 5/12 |
| 2006/0108962 | A1* | 5/2006 | Murray | G05D 23/1919 |
| | | | | 318/610 |
| 2007/0097212 | A1* | 5/2007 | Farneman | H04N 7/185 |
| | | | | 348/143 |
| 2014/0068311 | A1* | 3/2014 | Jenne | G06F 1/3296 |
| | | | | 713/340 |
| 2017/0234317 | A1* | 8/2017 | Cheah | F04D 25/06 |
| | | | | 416/1 |

FOREIGN PATENT DOCUMENTS

| JP | 3501491 B2 | 12/2003 |
| WO | WO 2005086334 A1 | 9/2005 |

* cited by examiner

*Primary Examiner* — Bryan R Perez
(74) *Attorney, Agent, or Firm* — Larson Newman, LLP

(57) ABSTRACT

An information handling system includes a cooling fan, a voltage regulator, and a slew rate controller. The voltage regulator is configurable to drive a power device with a selectable slew rate. The slew rate controller directs the voltage regulator to change the selectable slew rate in response to determining the operating condition of the cooling fan.

16 Claims, 3 Drawing Sheets

SYSTEM AND METHOD FOR CONTROLLING A DYNAMIC VOLTAGE REGULATOR SLEW RATE IN AN INFORMATION HANDLING SYSTEM

FIELD OF THE DISCLOSURE

This disclosure generally relates to information handling systems, and more particularly relates to controlling a dynamic voltage regulator slew rate control in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system includes a cooling fan, a voltage regulator, and a slew rate controller. The voltage regulator is configurable to drive a power device with a selectable slew rate. The slew rate controller directs the voltage regulator to change the selectable slew rate in response to determining the operating condition of the cooling fan.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
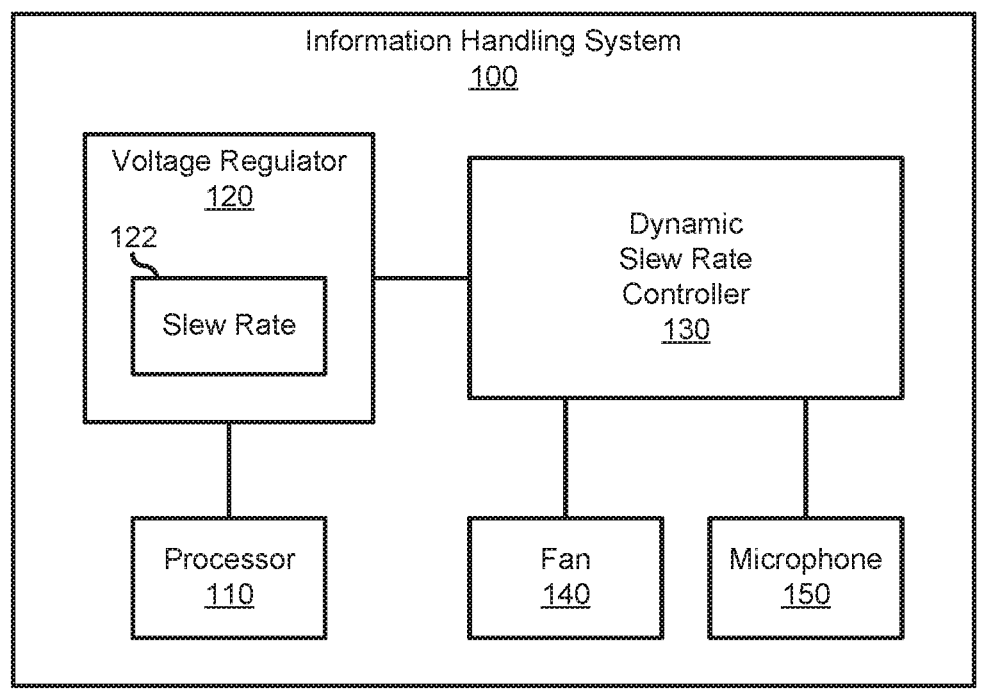
FIG. 1 is a block diagram illustrating an information handling system according to an embodiment of the present disclosure.

FIG. 1 illustrates an information handling system 100, including a processor 110, a voltage regulator 120, a dynamic slew rate controller 130, a fan 140, a microphone 150, and a baseboard management controller (BMC) 160. Information handling system 110 may include other elements such as are typically utilized in an information handling system, including various volatile and non-volatile data storage devices such as Dual In-Line Memory Modules (DIMMS), Solid-State Drives (SSDs), disk drives, and the like, various human input devices (HIDs) such as a keyboard, a mouse, a touch pad or touch screen, and the like, various wired and wireless network devices such as an Ethernet interface, a wireless interface, and the like, or other elements as needed or desired. Processor 110 represents one or more central processing unit (CPU), processor cores, or other processing devices, as needed or desired.

Voltage regulator 120 represents a device provided on a printed circuit board (PCB) of information handling system 100 that is dedicated to conditioning various voltage rails of the PCB into regulated and closely controlled voltage rails that are provided for the use of processor 110. For example, voltage regulator 120 may include a voltage regulator module (VRM), processor power module (PPM), another voltage regulating device, or the like, as needed or desired. It will be understood that a voltage regulator such as voltage regulator 120 may typically be designed in accordance with a voltage regulation specification that is associated with a particular brand or model of processor, and that such a specification may be proprietary to the manufacturer of the processor. Moreover, the details of voltage regulation for a processor are known in the art and will not be further disclosed herein, except as needed to describe the present embodiments.

Voltage regulator 120 is configurable in terms of various performance characteristics, such as voltage levels supplied to processor 110, thermal limits, duty cycles, power phase controls, and the like. In particular, voltage regulator 120 includes a slew rate setting 122 that permits the adjustment of the slew-rate, or turn-on rate, of the power devices in the voltage regulator. In particular, voltage regulator 120 may have a maximum unadjusted slew rate, as specified by a voltage per time. Slew rate setting 122 may be configurable by writing a bit pattern to the slew rate setting. The bit pattern encodes various slower slew rates for voltage regulator 120. For example, where slew rate setting 122 represents a 2-bit setting, a setting of 0xb00 may set voltage regulator 120 to operate at the maximum (FAST) slew rate, a setting of 0xb01 may set the voltage regulator to operate half the maximum (FAST/2) slew rate, a setting of 0xb10 may set the voltage regulator to operate a quarter of the maximum (FAST/4) slew rate, and a setting of 0xb11 may set the voltage regulator to operate an eighth of the maximum (FAST/8) slew rate.

The inventors of the present disclosure have understood that electrical and electronic components that operate at high frequencies and with fast slew rates may oscillate at audible frequencies (typically between 20 and 20,000 Hz). Where information handling system 100 represents an element of enterprise equipment, such oscillations may not be of concern since such equipment is typically located in a data center or other location that does not have much human interaction. However, where information handling system 100 represents an element of end user equipment, such as a laptop or desktop computer, a work station, or the like, such oscillations may represent an annoyance that negatively impacts the end user's experience and enjoyment of the information handling system.

Dynamic slew rate controller 130 represents an element of information handling system 100 that operates to control the slew rate of voltage regulator 120 by writing various values to slew rate setting 122 based upon the operating condition of the information handling system. In a particular embodiment, dynamic slew rate controller 130 operates in-band with processor 110. That is, the operation of dynamic slew rate controller 130 is provided based upon the execution by processor 110 of code that implements the functions and feature of the dynamic slew rate controller as described below. Here, dynamic slew rate controller 130 may also represent firmware or software instantiated on information handling system 100, such as a system BIOS or UEFI, device firmware, OS functionality, an application, or the like, that is configured to provide the functions and features of the dynamic slew rate controller as described below.

In another embodiment, dynamic slew rate controller 130 operates out-of-band with processor 110. That is, the operation of dynamic slew rate controller 130 is provided based upon a hardware circuit that is independent of processor 110, or based upon the execution by a separate processor or controller of code that operates independently of the processor. In yet another embodiment, the functions and features of dynamic slew rate controller 130 may be provided by a combination of in-band and out-of-band elements, as needed or desired. In a particular embodiment, dynamic slew rate controller 130 includes BMC 160.

Dynamic slew rate controller 130 operates to reduce the slew rate value when it is determined that oscillations of the components of voltage regulator 120 are audible, and are otherwise unmasked by other noise sources on information handling system 100. In particular, dynamic slew rate controller 130 operates to determine if fan 140 is operating. Here, it will be understood that the noise from a cooling fan in an information handling system may mask, or be louder than any noise from the electrical and electronic components of the information handling system, especially when the cooling fan is operating at a high speed. As such, when fan 140 is not operating, dynamic slew rate controller 130 operates to provide a slew rate value to slew rate setting 122 that provides a low slew rate. For example, when fan 140 is not operating, dynamic slew rate controller 130 can provide a slew rate value to slew rate setting 133 that sets the slew rate for voltage regulator 120 to the FAST/4 or FAST/8 slew rate, thereby greatly reducing the audible oscillations from the components of the voltage regulator.

Dynamic slew rate controller 130 also operates to detect the noise from oscillations of the components of voltage regulator 120 are audible by detecting such oscillations via microphone 150. Here, when fan 140 is operating, but at a slower speed that only partially masks the noise from voltage regulator 120, dynamic slew rate controller 130 operates to provide a slew rate value to slew rate setting 122 that provides a medium slew rate. For example, when fan 140 is operating at a slow speed, such that the noise from voltage regulator 120 is only partially masked by the fan, dynamic slew rate controller 130 can provide a slew rate value to slew rate setting 133 that sets the slew rate for voltage regulator 120 to the FAST/2 slew rate, thereby partially reducing the audible oscillations from the components of the voltage regulator.

Finally, when fan 140 is operating at a high speed, such that the noise from voltage regulator 120 is fully masked by the fan, dynamic slew rate controller 130 operates to provide a slew rate value to slew rate setting 122 that provides a high slew rate. For example, when fan 140 is operating at a high speed, such that the noise from voltage regulator 120 is fully masked by the fan, dynamic slew rate controller 130 can provide a slew rate value to slew rate setting 133 that sets the slew rate for voltage regulator 120 to the FAST slew rate.

Figure 2:
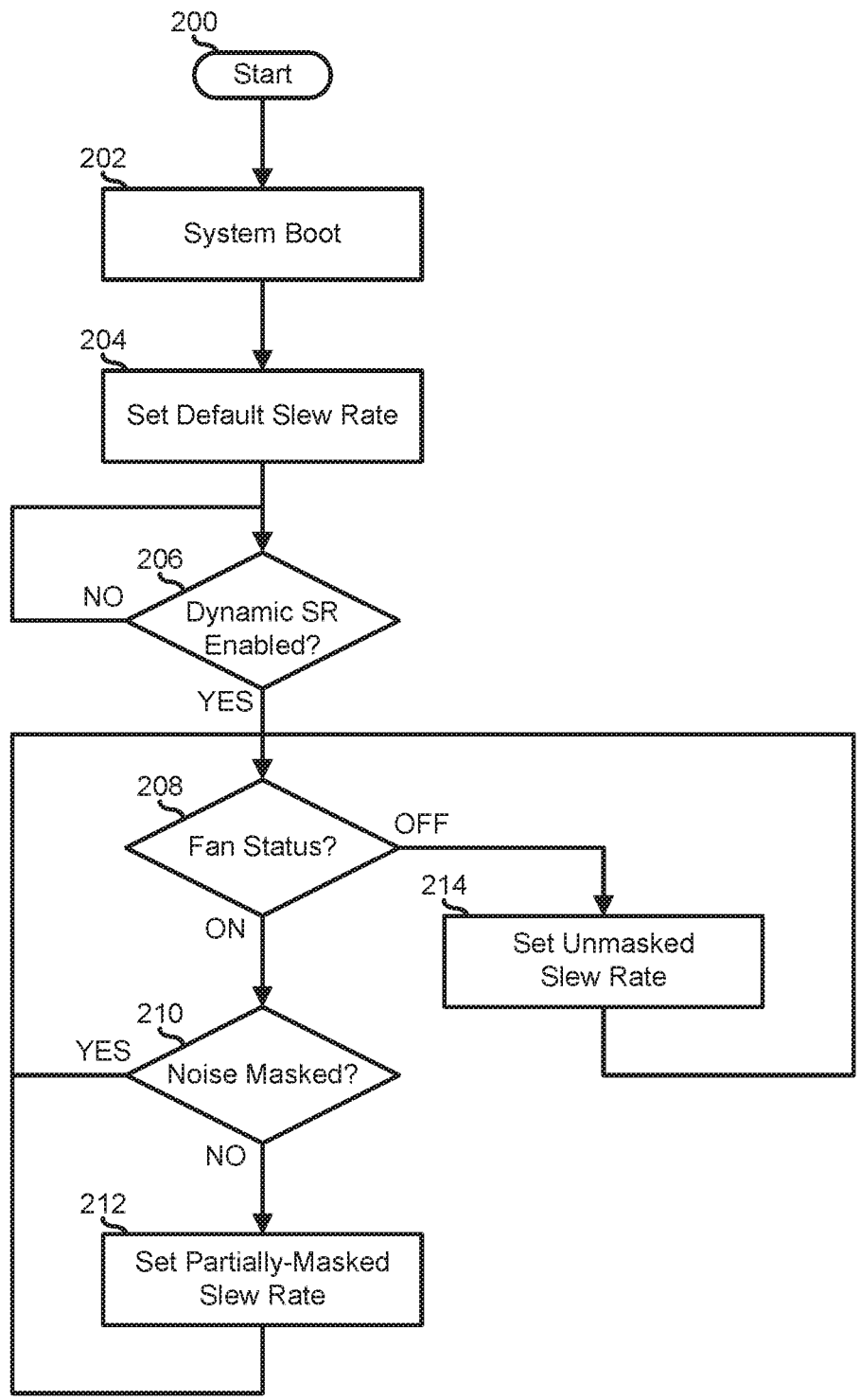
FIG. 2 is a flowchart illustrating a method for controlling a dynamic voltage regulator slew rate according to an embodiment of the present disclosure.

FIG. 2 illustrates a method for providing dynamic voltage regulator slew rate control, starting at block 200. An information handling system is booted in bock 202, and a voltage regulator slew rate is set at a default value in block 204. For example, the slew rate for a voltage regulator may be set at a FAST slew rate. A decision is made as to whether or not a dynamic slew rate mode is enabled in decision block 206. For example, a system BIOS or user selectable option may toggle the information handling system into or out of a dynamic slew rate mode. If the dynamic slew rate mode is not enabled, the "NO" branch of decision block 206 is taken and the method returns to decision block 206 until the dynamic slew rate mode is enabled. When the dynamic slew rate mode is enabled, the "YES" branch of decision block 206 is taken and a decision is made as to whether or not a cooling fan is on or off in decision block 208. If the cooling fan is off, the "OFF" branch of decision block 208 is taken, an unmasked slew rate value is provided to the voltage regulator in block 214, and the method returns to decision block 208 until the cooling fan is turned on. For example, when a cooling fan is off, the slew rate for the voltage regulator may be set at a FAST/4 of FAST/8 slew rate.

When the cooling fan is on, the "ON" branch of decision block 208 is taken and a decision is made as to whether or not the audible noise from the voltage regulator is masked by the cooling fan speed in decision block 210. For example, a microphone can compare the noise level due to oscillations of the components of the voltage regulator with the noise level due to the cooling fan. If the audible noise from the voltage regulator is masked by the cooling fan speed, the "YES" branch of decision block 210 is taken and the method returns to decision block 208 where a decision is made based upon the fan status. If the audible noise from the voltage regulator is not masked by the cooling fan speed, the "NO" branch of decision block 210 is taken, a partially masked slew rate value is provided to the voltage regulator in block 212, and the method returns to decision block 208 where a decision is made based upon the fan status. For example, when the audible noise from the voltage regulator is not masked by the cooling fan speed, the slew rate for the voltage regulator may be set at a FAST/2 slew rate.

Figure 3:
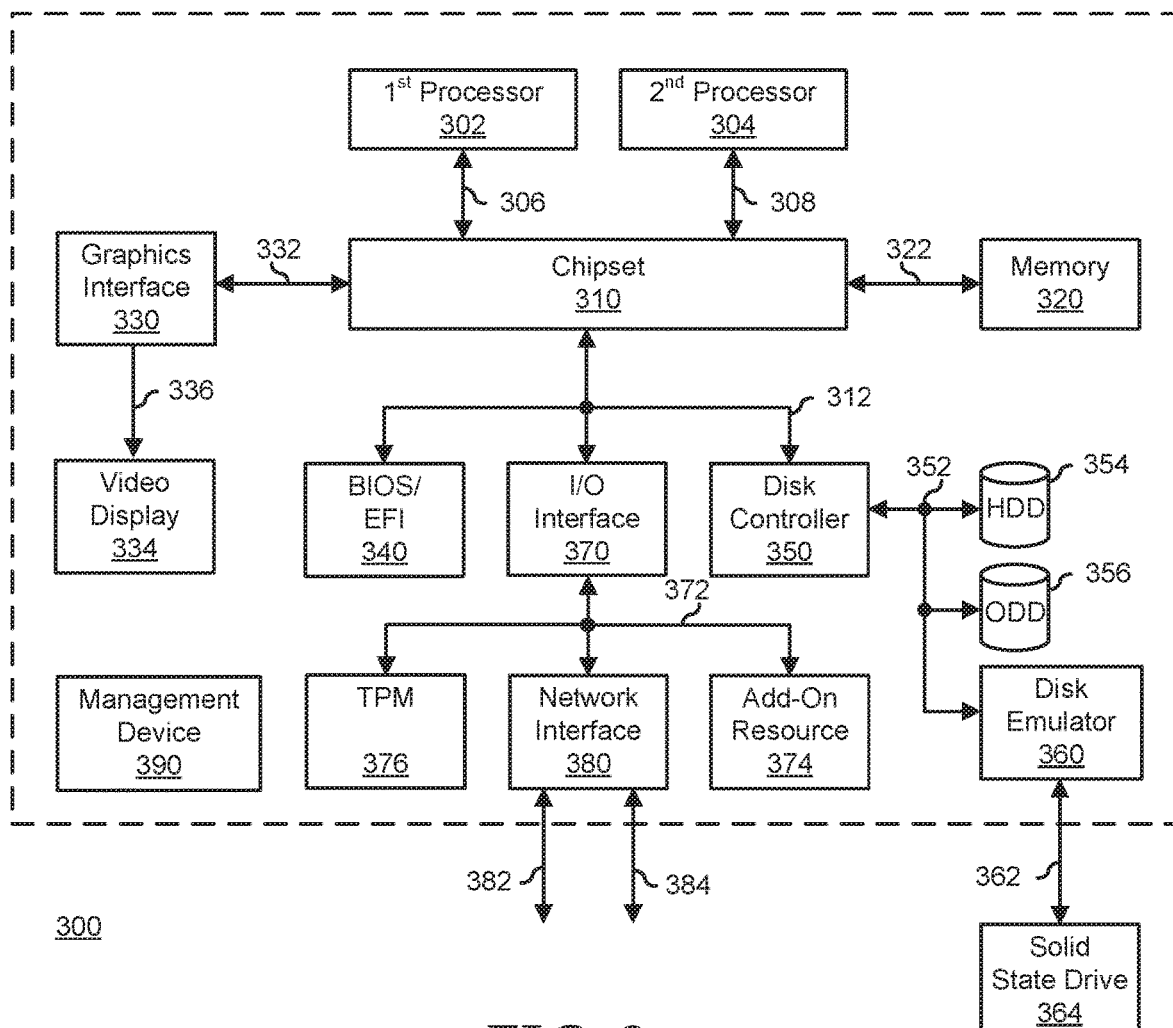
FIG. 3 is a block diagram illustrating an information handling system according to another embodiment of the present disclosure.

FIG. 3 illustrates a generalized embodiment of an information handling system 300 similar to information handling system 110. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, a chipset 310, a memory 320, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an input/output (I/O) interface 370, one or more add-on resources 374, a trusted platform module (TPM) 376, a network interface 380, a management device 390, and a power supply 395. Processors 302 and 304, chipset 310, memory 320, graphics interface 330, BIOS/UEFI module 340, disk controller 350, HDD 354, ODD 356, disk emulator 360, SSD 362, I/O interface 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to chipset 310 via processor interface 306, and processor 304 is connected to the chipset via processor interface 308. Memory 320 is connected to chipset 310 via a memory bus 322. Graphics interface 330 is connected to chipset 310 via a graphics interface 332, and provides a video display output 336 to a video display 334. In a particular embodiment, information handling system 300 includes separate memories that are dedicated to each of processors 302 and 304 via separate memory interfaces. An example of memory 320 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O interface 370 are connected to chipset 310 via an I/O channel 312. An example of I/O channel 312 includes a Peripheral Component Interconnect (PCI) interface, a PCI-Extended (PCI-X) interface, a high speed PCI-Express (PCIe) interface, another industry standard or proprietary communication interface, or a combination thereof. Chipset 310 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O interface 370 includes a peripheral interface 372 that connects the I/O interface to add-on resource 374, to TPM 376, and to network interface 380. Peripheral interface 372 can be the same type of interface as I/O channel 312, or can be a different type of interface. As such, I/O interface 370 extends the capacity of I/O channel 312 when peripheral interface 372 and the I/O channel are of the same type, and the I/O interface translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as chipset 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 may include a commercially available BMC product that operates in accordance with an Intelligent Platform Management Initiative (IPMI) specification, such as a Integrated Dell Remote Access Controller (iDRAC), or the like. Management device 390 may further include associated memory devices, logic devices, security devices, or the like, as needed or desired.

Power supply 395 represents one or more devices for power distribution to the components of information handling system 300. In particular, power supply 395 can include a main power supply that receives power from an input power source, such as a wall power outlet, a power strip, a battery, or another power source, as needed or desired. Here, power source 395 operates to convert the power at a first voltage level from the input power source to one or more power rails that are utilized by the components of information handling system. Power supply 395 can also include one or more voltage regulators (VRs) that each receive power from the main power supply and that operate to convert the input voltage to an output voltage that is used by one or more components of information handling system. For example, a VR can be provided for each of processors 302 and 304, and another VR can be provided for memory 320. Power supply 395 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising: a device; a cooling fan; a voltage regulator configurable to drive the device with one of a plurality of selectable slew rates; and a slew rate controller configured to: determine an operating condition of the cooling fan; and direct the voltage regulator to change the selectable slew rate from a first slew rate to a second slew rate in response to determining the operating condition of the cooling fan;
   wherein when the operating condition of the cooling fan is off, the first slew rate is faster than the second slew rate;
   and when the operating condition of the cooling fan is on, to: determine whether the fan is operating at a high speed or at a low speed; and direct the voltage regulator to change the selectable slew rate from the first slew rate to a third slew rate in response to determining that the cooling fan is operating at the high speed.

2. The information handling system of claim 1, wherein the third slew rate is slower than the first slew rate and is faster than the second slew rate.

3. The information handling system of claim 2, wherein when the operating condition of the cooling fan is on, the slew rate controller is further configured to direct the voltage regulator to change the selectable slew rate from the first slew rate to a fourth slew rate in response to determining that the cooling fan is operating at the low speed.

4. The information handling system of claim 3, wherein the fourth slew rate is slower than the third slew rate and is faster than the second slew rate.

5. The information handling system of claim 1, wherein the first slew rate is a fastest slew rate.

6. The information handling system of claim 1, wherein the slew rate controller includes code executable by a processor.

7. The information handling system of claim 1, wherein the slew rate controller includes a baseboard management controller.

8. The information handling system of claim 1, further comprising a microphone, wherein the slew rate controller further directs the voltage regulator to change the selectable slew rate from the first slew rate to the second slew rate in response to a sound level received by the microphone.

9. A method for reducing noise levels in an information handling system, the method comprising: setting, in a voltage regulator configurable to drive a device with one of a plurality of selectable slew rates, the selectable slew rate to a first slew rate; determining, by a slew rate controller, an operating condition of a cooling fan; and directing the voltage regulator to change the selectable slew rate from the first slew rate to a second slew rate in response to determining the operating condition of the cooling fan;
   wherein when the operating condition of the cooling fan is off, the first slew rate is faster than the second slew rate;

and when the operating condition of the cooling fan is on:
  determining, by the slew rate controller, whether the fan is operating at a high speed or at a low speed; and
  directing, by the slew rate controller, the voltage regulator to change the selectable slew rate from the first slew rate to a third slew rate in response to determining that the cooling fan is operating at the high speed.

10. The method of claim 9, wherein the third slew rate is slower than the first slew rate and is faster than the second slew rate.

11. The method of claim 10, wherein, when the operating condition of the cooling fan is on, the slew rate controller is further configured to direct the voltage regulator to change the selectable slew rate from the first slew rate to a fourth slew rate in response to determining that the cooling fan is operating at the low speed.

12. The method of claim 11, wherein the fourth slew rate is slower than the third slew rate and is faster than the second slew rate.

13. The method of claim 9, wherein the first slew rate is a fastest slew rate.

14. The method of claim 9, wherein the slew rate controller includes code executable by a processor.

15. The method of claim 9, wherein the slew rate controller includes a baseboard management controller.

16. An information handling system, comprising:
  a cooling fan;
  a microphone;
  a voltage regulator configurable to drive a device with one of a plurality of selectable slew rates; and
  a slew rate controller configured to:
    determine that the cooling fan is off;
    determine that the microphone detects audible oscillations from the voltage regulator; and
    direct the voltage regulator to change the selectable slew rate from a fast slew rate to a slow slew rate in response to determining that the cooling fan is off and that the microphone detects audible oscillations from the voltage regulator.

* * * * *